(12) United States Patent
Miyato (10) Patent No.: US 6,521,937 B1
(45) Date of Patent: Feb. 18, 2003

(54) MEMORY CELL DEVICE INCLUDING OVERLAPPING CAPACITORS

(75) Inventor: Takashi Miyato, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/635,258

(22) Filed: Aug. 9, 2000

(30) Foreign Application Priority Data

Sep. 2, 1999 (JP) .......................................... 11-248177

(51) Int. Cl.⁷ ...................... H01L 27/108; H01L 29/76; H01L 29/94; H01L 31/119
(52) U.S. Cl. ...................... 257/303; 257/306; 257/309
(58) Field of Search ................................ 257/303, 304, 257/306, 307, 308, 309; 438/239, 253, 254, 255, 393, 396, 397, 398

(56) References Cited

U.S. PATENT DOCUMENTS

| | | | | |
|---|---|---|---|---|
| 5,135,883 A | * | 8/1992 | Bae et al. ................... | 257/308 |
| 5,138,412 A | | 8/1992 | Hieda et al. | |
| 5,362,665 A | * | 11/1994 | Lu ............................... | 438/253 |
| 5,541,428 A | * | 7/1996 | Nagatomo ................... | 257/306 |
| 5,731,949 A | * | 3/1998 | Ko .............................. | 257/301 |
| 6,274,427 B1 | * | 8/2001 | Iwasaki ....................... | 438/253 |

FOREIGN PATENT DOCUMENTS

| | | |
|---|---|---|
| JP | 2-94471 | 4/1990 |
| JP | 4-257257 | 9/1992 |
| JP | 4-297065 | 10/1992 |
| JP | 7-22595 | 1/1995 |
| JP | 10-256508 | 9/1998 |
| KR | 91-19225 | 11/1991 |

* cited by examiner

Primary Examiner—Olik Chaudhuri
Assistant Examiner—Hoai Pham
(74) Attorney, Agent, or Firm—Leydig, Voit & Mayer, Ltd.

(57) ABSTRACT

In a semiconductor device including memory cells, the capacitors of adjoining memory cells are located in different layers, and a first region with a first capacitor and a second region adjoining a second capacitor partly overlap viewed in plane.

5 Claims, 11 Drawing Sheets

MEMORY CELL DEVICE INCLUDING OVERLAPPING CAPACITORS

BACKGROUND OF THE INVENTION

1. Field of the Invention

The present invention relates to a semiconductor device providing substantial capacitance in memory cells and a method for preparing the semiconductor device.

2. Discussion of Background

Figure 11:
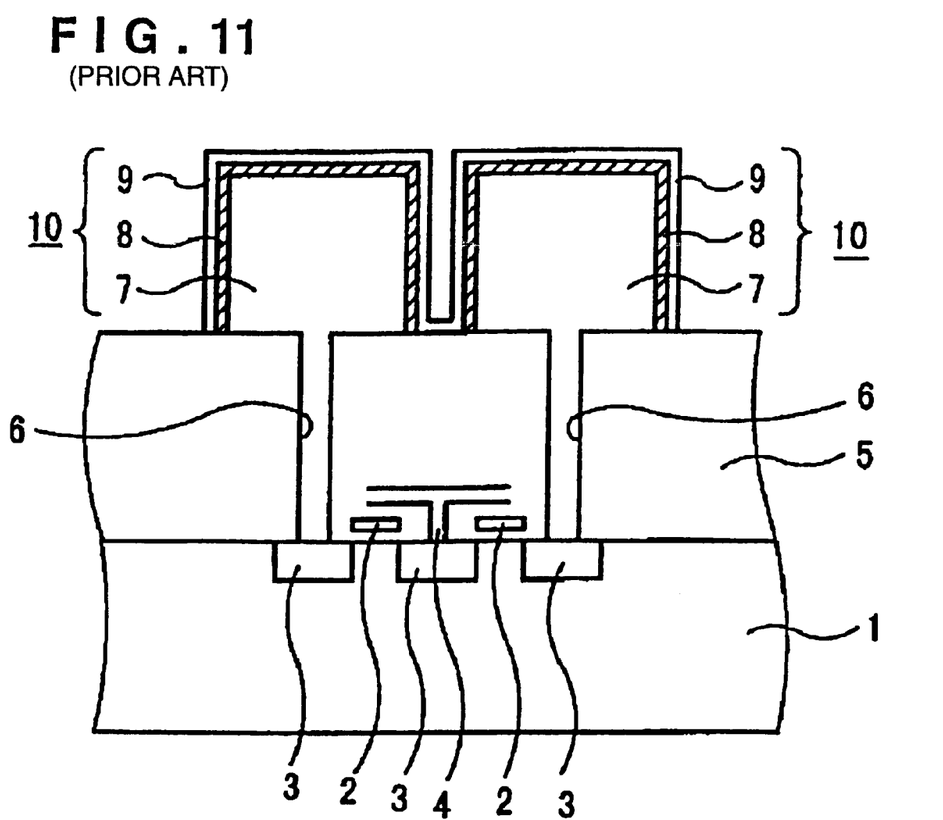
FIG. 11 shows a conventional semiconductor device.

In FIG. 11 is shown a cross-sectional view of the structure of a conventional semiconductor device. In this Figure, reference numeral 1 designates a semiconductor substrate, reference numeral 2 designates a gate lines formed on the semiconductor substrate 1, reference numeral 3 designates diffused regions in the semiconductor substrate 1, reference numeral 4 designates one of bit lines connected to diffused regions, reference numeral 5 designates an interlayer dielectric film covering the bit lines 4, and reference numeral 6 designates contact holes in the interlayer dielectric film 5 extending to the diffused regions 3.

Reference numeral 7 designates storage nodes, which fill the contact holes 6 and provided on the interlayer dielectric film 5. Reference numeral 8 designates insulating films, which are cover the storage nodes 7. Reference numeral 9 designates a cell plate, which covers the insulating films 8. The storage nodes 7, the insulating films 8 and the cell plate 9 form a capacitor 10. Such a capacitor is provided at plural locations in a single layer.

The conventional semiconductor device thus constructed has difficulty in ensuring required capacitance since the distance between the storage nodes of the respective capacitors decreases and the storage nodes per se have areas that decrease as the semiconductor device becomes smaller.

In order to solve this problem, there is a method to extend the height of the storage nodes per se to enlarge the area, increasing the capacitance. In this case, there has been created a problem in that large steps are provided between regions with the storage nodes and regions without the storage nodes and that cause problems in subsequent processing.

SUMMARY OF THE INVENTION

It is an object of the present invention to solve these problems, and to provide a semiconductor device capable of ensuring much capacitor capacity and a method for preparing the semiconductor device.

According to a first aspect of the present invention, there is provided a semiconductor device comprising a plurality of memory cells, and the respective memory cells having capacitors, the capacitors of adjoining memory cells provided in different layers, wherein a region with a capacitor formed therein and a region with an adjoining formed therein partly overlap in a planar direction.

According to a second aspect of the present invention, the capacitors are alternately provided in an upper layer and a lower layer in the first aspect.

According to a third aspect of the present invention, the respective capacitors have storage nodes formed in a cylindrical shape and/or formed so as to have a rough surface in the first or second aspect.

According to a fourth aspect of the present invention, the respective capacitors have at least of an upper side and a lower side of storage nodes provided with a cell plate in one of the first to third aspects.

According to a fifth aspect of the present invention, there is provided a method for preparing a semiconductor device comprising the steps of forming holes in an interlayer dielectric film provided on a semiconductor substrate up to a semiconductor substrate to form a plurality of capacitors at certain intervals for electrical conduction with a semiconductor substrate in a lower layer on the interlayer dielectric film; and forming holes up to the semiconductor substrate at certain spaced locations to form a plurality of capacitors for electrical conduction with the semiconductor substrate in an upper layer above the lower layer so as to partly overlap regions in the lower layer with the capacitors formed therein and regions in the upper layer with the capacitors formed therein in a planar direction.

As explained, in, accordance with the first aspect, the semiconductor device with the plural memory cells have the capacitors of adjoining memory cells provided in different layers, wherein a region with a capacitor formed therein and a region with an adjoining capacitor formed therein partly overlap in a planar direction. As a result, the semiconductor device can be provided so as to have the capacitor area enlarged and consequently to ensure much capacitor capacity.

In accordance with the second aspect, the capacitors are alternately provided in the upper layer and the lower layer in the first aspect. As a result, the semiconductor device can be provided to be formed easily.

In accordance with the third aspect, the respective capacitors have storage nodes formed in a cylindrical shape and/or formed so as to have a rough surface in the first or second aspect. As a result, the semiconductor device can be provided so as to have the capacitor area further enlarged and consequently to ensure much more capacitor capacity.

In accordance with the fourth aspect, the respective capacitors have at least one of an upper side and a lower side of storage nodes provided with a cell plate in any one of the first to third aspects. As a result, the semiconductor device can be provided so as to have the capacitor area further enlarged and consequently to ensure much more capacitor capacity.

In accordance with the fifth aspect, there is provided the method for preparing a semiconductor device comprising the steps of forming holes in the interlayer dielectric film provided on the semiconductor substrate up to the semiconductor substrate to form a plurality of capacitors at certain intervals for electrical conduction with a semiconductor substrate in a lower layer on the interlayer dielectric film; and forming holes up to the semiconductor substrate at certain spaced locations to form a plurality of capacitors for electrical conduction with the semiconductor substrate in an upper layer above the lower layer so as to partly overlap regions in the lower layer with the capacitors formed therein and regions in the upper layer with the capacitors formed therein in a planar direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Embodiment 1

Figure 1:
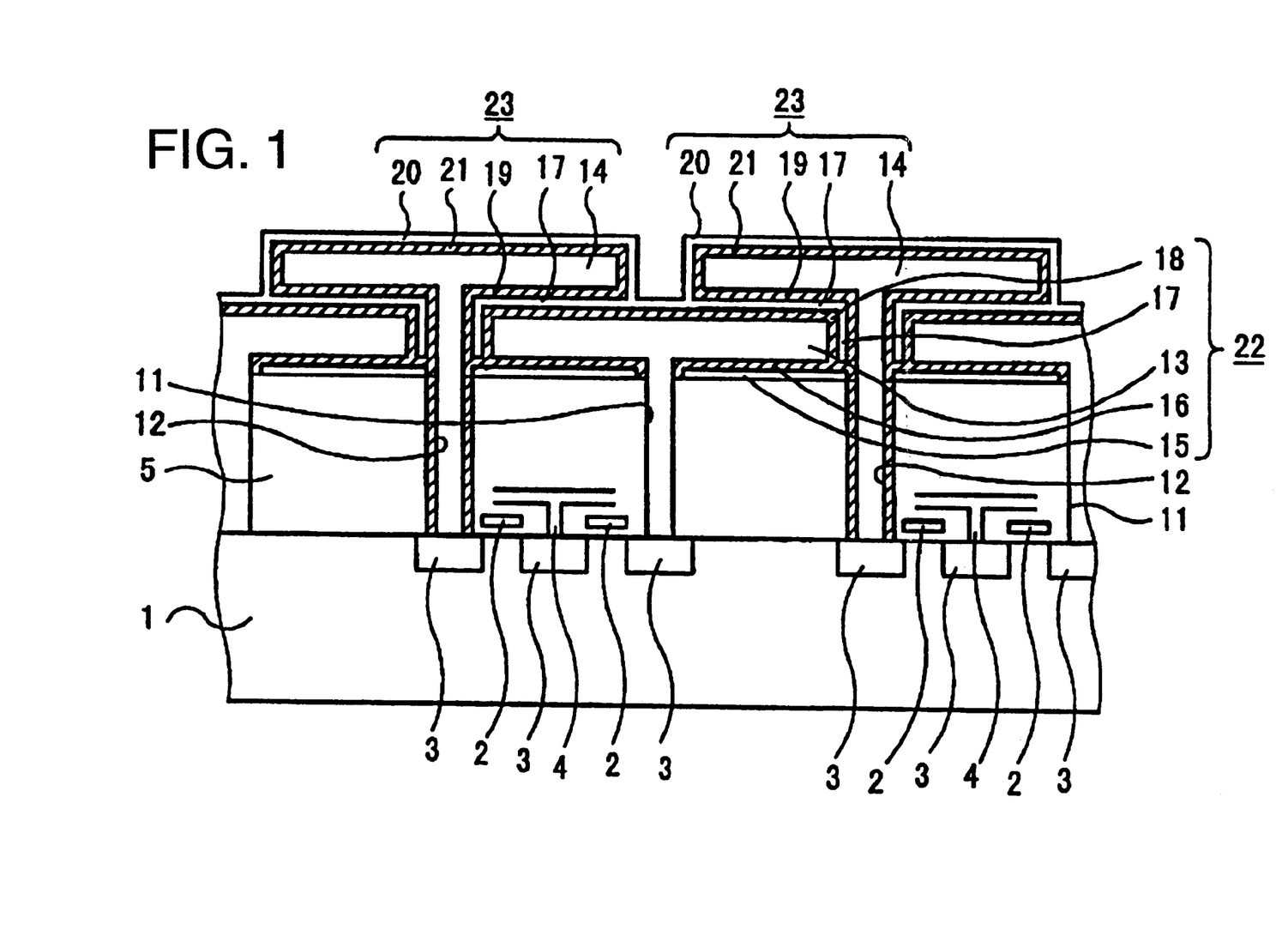
FIG. 1 is a cross-sectional view showing the structure of the semiconductor device according to a first embodiment of the present invention.

Now, an embodiment according to the present invention will be described. In FIG. 1 is shown a cross-sectional view of the structure of the semiconductor device according to the embodiment. In this Figure, parts similar or identical to the parts of the conventional semiconductor device are designated with the same reference numerals, and explanation of these parts will be omitted. Reference numeral 11 designates lower layer contact holes, in an interlayer dielectric film 5 extending to diffused layers 3. Reference numeral 12 designates upper layer contact holes, in the interlayer dielectric film 5 extending to diffused layers.

Reference numeral 13 designates one of lower layer storage nodes, which fill the lower layer contact holes 11 for electrical conduction in a semiconductor substrate 1 and are formed in a lower layer on the interlayer dielectric film 5, and which are provided at certain intervals. The upper layer contact holes 12 are provided at certain spaced locations. Reference numeral 14 designates upper layer storage nodes, which fill the upper layer contact holes 12 for electrical conduction with the semiconductor substrate 1 and are located in an upper layer above the lower layer storage nodes 13 and have regions partly overlapped with the lower layer storage nodes 13 in a planar direction.

Reference numeral 15 designates one of lower layer cell plates, which are formed on lower sides of the lower layer storage nodes 13 through lower layer insulating films 16. Reference numeral 17 designates one of cell plates, which are formed on upper sides of lower layer storage nodes 13 through lower layer insulating films 18, and are formed on lower sides of the upper layer storage nodes 14 through upper layer insulating films 19. Reference numeral 20 designates upper layer cell plates, which are formed on upper sides of the upper layer storage nodes 14 through upper layer insulating films 21.

A lower layer capacitor 22 is formed from a lower layer storage node 13, a lower layer cell plate 15, lower layer insulating films 16 and 18, and a cell plate 17. An upper capacitor 23 is formed from an upper layer storage node 14, an upper layer cell plate 20, upper layer insulating films 19 and 21, and a cell plate 17.

Next, a method for preparing the semiconductor device constructed according to the first embodiment will be explained, referring to FIGS. 1 through 7(c). With respect to FIGS. 2(a) through 7(c), explanation of the steps for forming gate lines 2, the diffused layers 3 and bit lines 4 formed on the semiconductor substrate, and explanation of the structures of these parts will be omitted. Explanation will be made with respect to the steps after these parts have been formed and the interlayer insulating film 5 has been deposited.

Figure 2A:
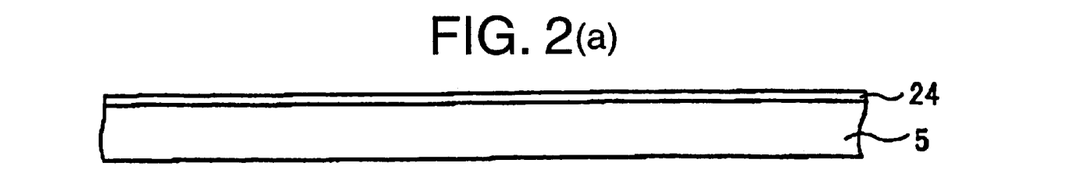
FIGS. 2(a)–2(d) are cross-sectional views showing a method for preparing the semiconductor device shown in FIG. 1.
Figure 2B:
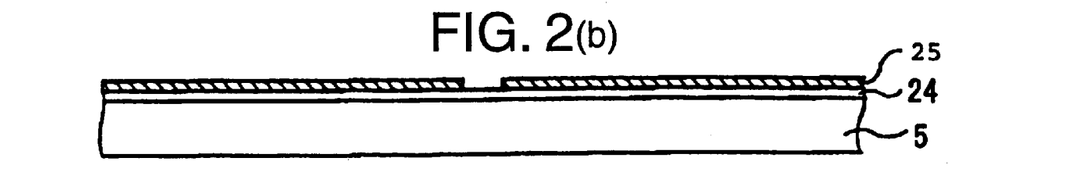
Figure 2C:
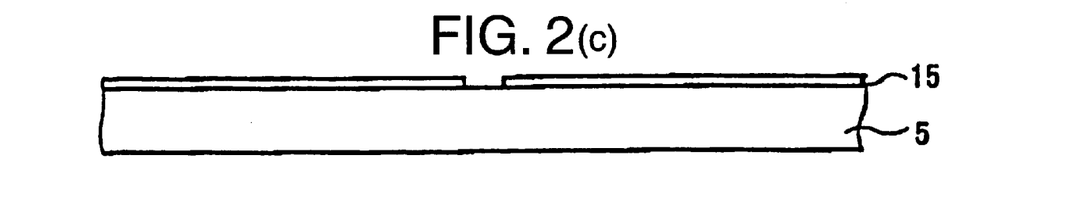
Figure 2D:
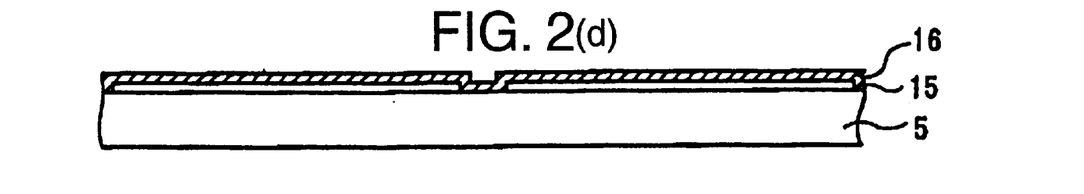

First, a conductive film 24 is deposited on the interlayer insulating film 5 (FIG. 2(a)). Next, a patterned resist 25 is formed on the conductive film (FIG. 2(b)). The conductive film 24 is etched, the resist 25 serving as a mask, to form the lower layer cell plates 15, and the resist 25 is removed (FIG. 2(c)). Next, the lower layer insulating film 16 is deposited on the lower layer cell plates 15 so as to cover the lower layer cell plates (FIG. 2(d)). Next, a patterned resist 26 is formed on the lower layer insulating film (FIG. 3(a)). The lower layer insulating film 16 and the interlayer insulating film 5 are etched, the resist 26 serving as a mask, to form the lower layer contact holes 11 extending to the diffused layers 3 in the semiconductor substrate 1, and the resist 26 is removed (FIG. 3(b)).

Figure 3A:
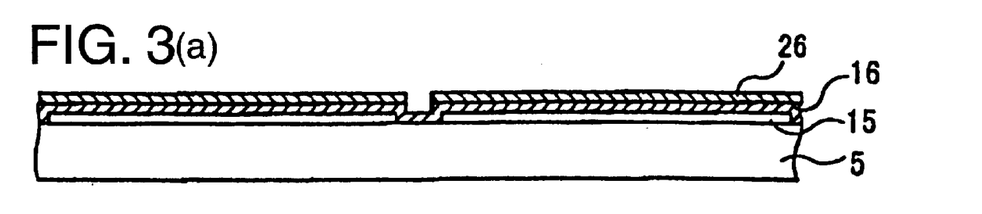
FIGS. 3(a)–3(d) are cross-sectional views showing a method for preparing the semiconductor device shown in FIG. 1.
Figure 3B:
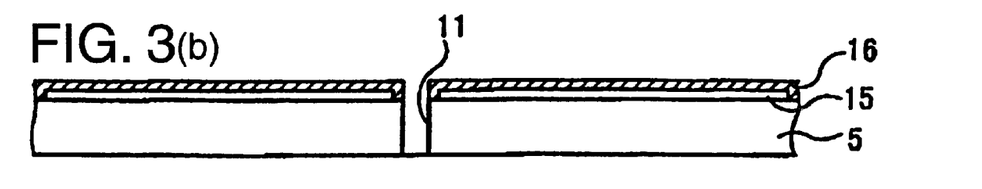
Figure 3C:
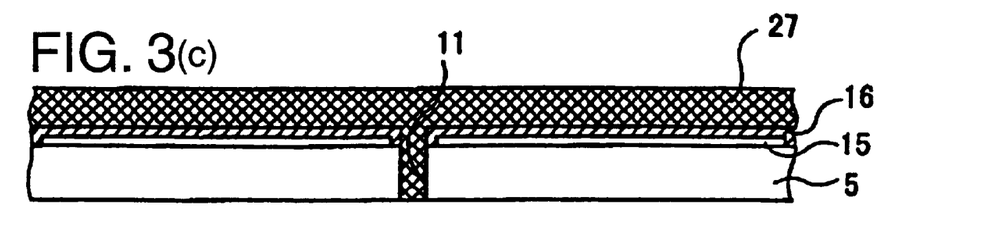
Figure 3D:
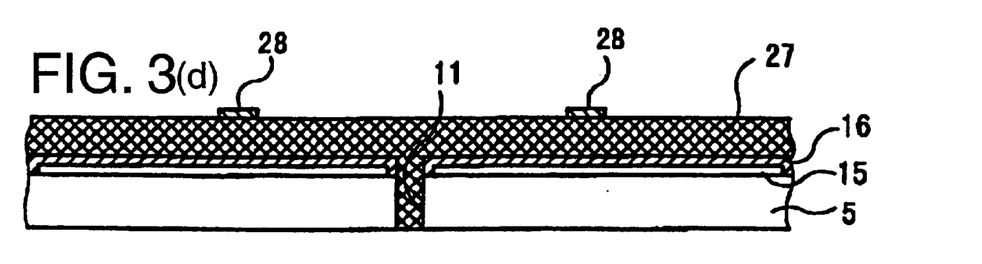

Next, an insulating film 27 is deposited so as to cover the entire plane, or on the lower layer insulating film and the lower layer contact holes (FIG. 3(c)). Next, a patterned resist 28 is formed on the insulating film (FIG. 3(d)). Next, the insulating film 27 is etched, the resist 28 serving as a mask, to form patterned insulating films 27a (FIG. 4(a)). Next, a conductive film 29 is deposited so as to be filled into the lower layer contact holes 11 and to cover the entire plane, or the lower layer insulating film 16, the patterned insulating film 27a and the resist 28 (FIG. 4(b)).

Figure 4A:
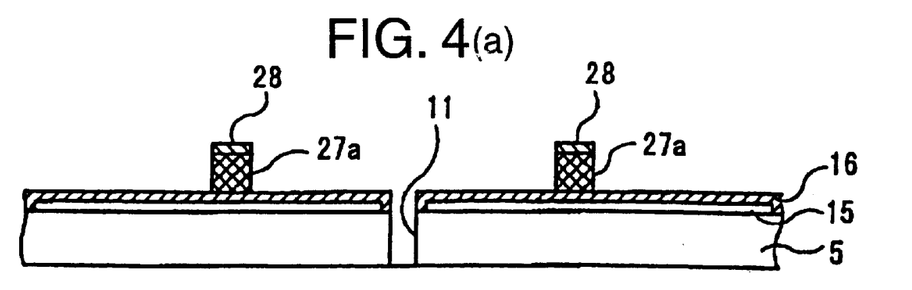
FIGS. 4(a)–4(d) are cross-sectional views showing a method for preparing the semiconductor device shown in FIG. 1.
Figure 4B:
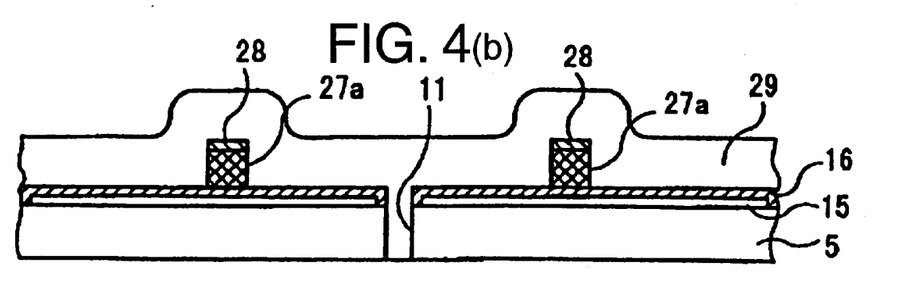
Figure 4C:
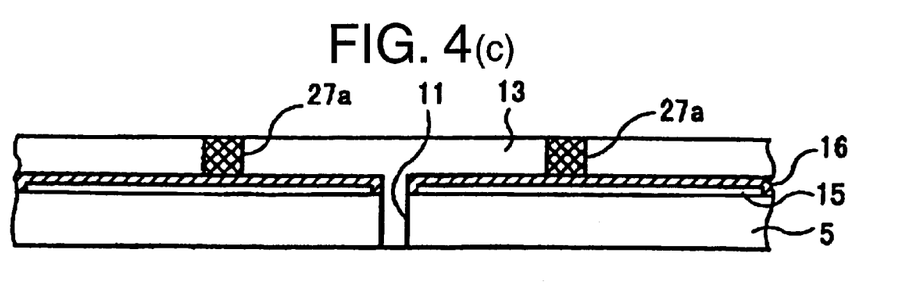
Figure 4D:
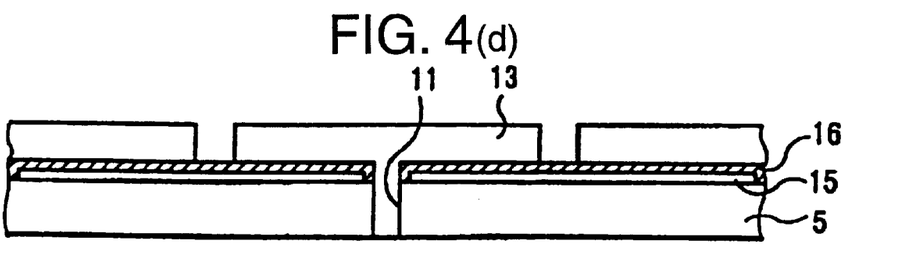

The lower layer storage nodes 13 are formed by carrying out etching back on the entire plane in accordance with, e.g., the CMP method, until upper sides of the insulating films 27a are exposed (FIG. 4(c)). When the insulating films 27a are removed, the lower layer storage nodes 13 are provided at the certain intervals (FIG. 4(d)). Next, the lower layer insulating film 18 is deposited so as to cover the entire plane (FIG. 5(a)).

Figure 5A:
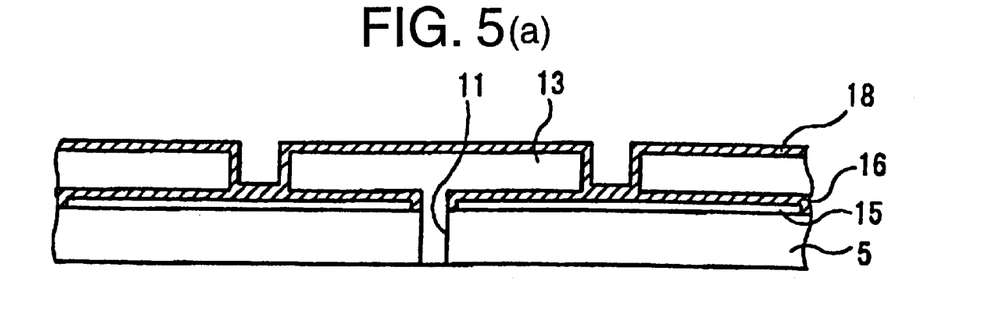
FIGS. 5(a)–5(d) are cross-sectional views showing a method for preparing the semiconductor device shown in FIG. 1.
Figure 5B:
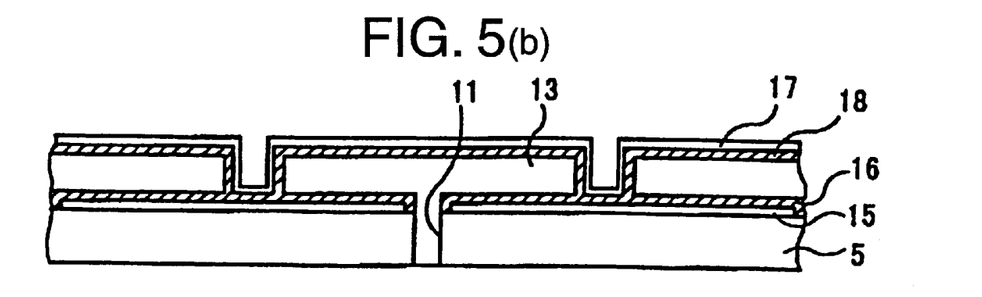
Figure 5C:
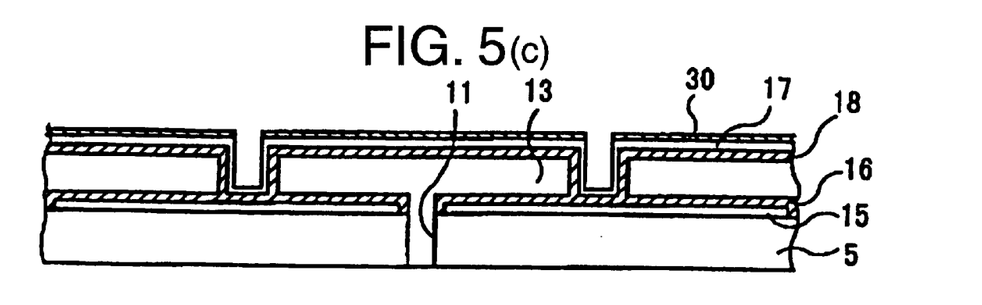
Figure 5D:
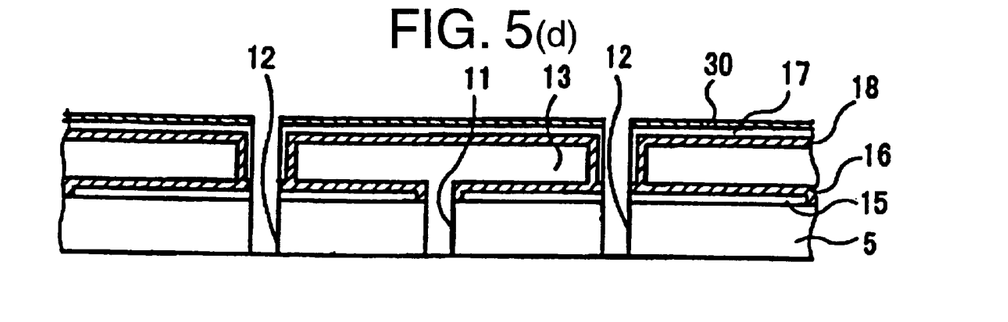

Now, the cell plate 17 is deposited so as to cover the entire plane (FIG. 5(b)). Next, a patterned resist 30 is formed on the cell plate (FIG. 5(c)). Next, the cell plate 17, the lower layer insulating film 18 and the interlayer dielectric film 5 are etched, the resist 30 serving as a mask, to form the upper layer contact holes 12 extending to the diffused layers in the semiconductor substrate 1 (FIG. 5(d)). At this step, the upper layer contact holes 12 are provided at certain spaced locations that have been given when forming the lower layer storage nodes 13.

Figure 6A:
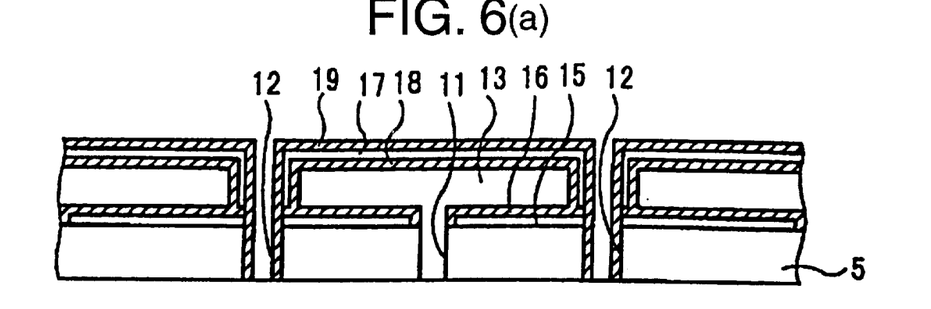
FIGS. 6(a)–6(d) are cross-sectional views showing a method for preparing the semiconductor device shown in FIG. 1.
Figure 6B:
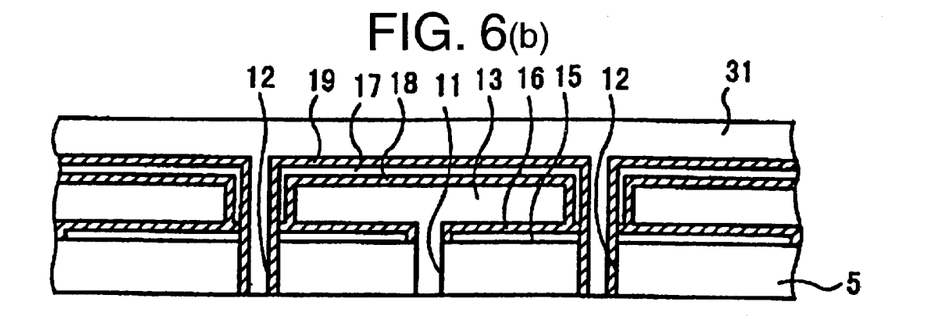
Figure 6C:
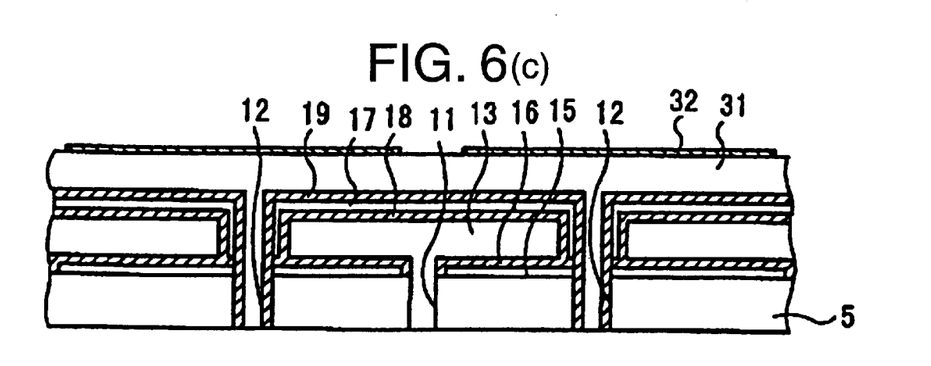
Figure 6D:
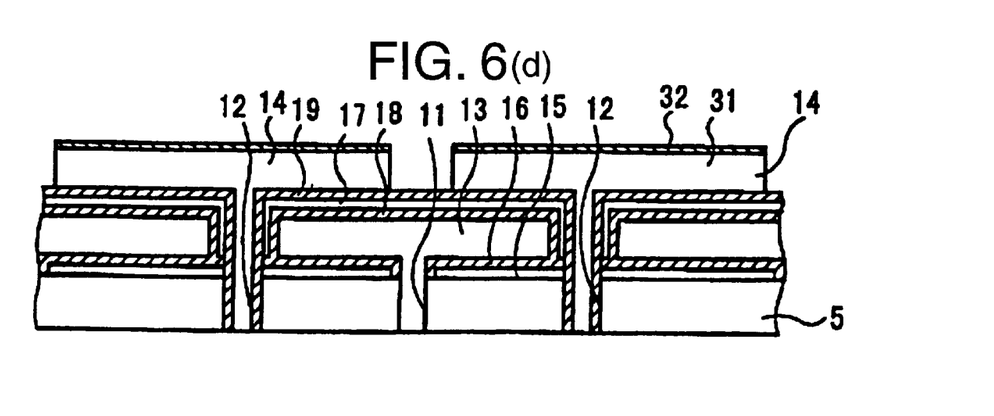
Figure 7A:
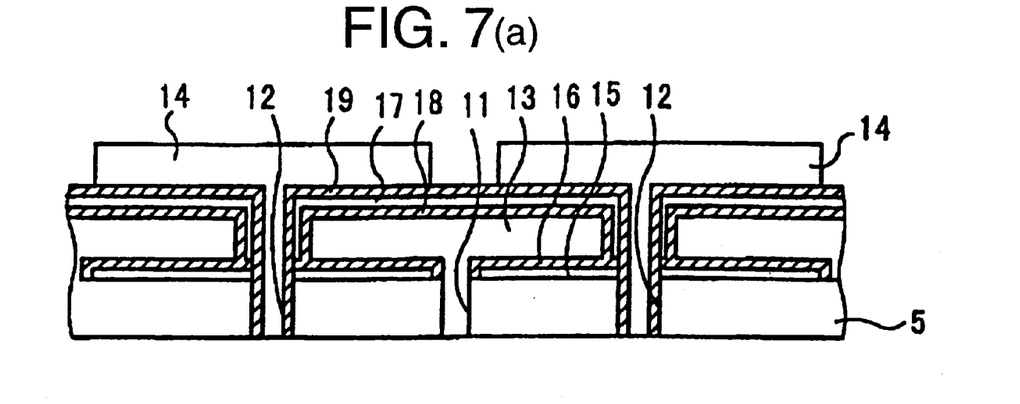
FIGS. 7(a)–7(c) are cross-sectional views showing a method for preparing the semiconductor device shown in FIG. 1.
Figure 7B:
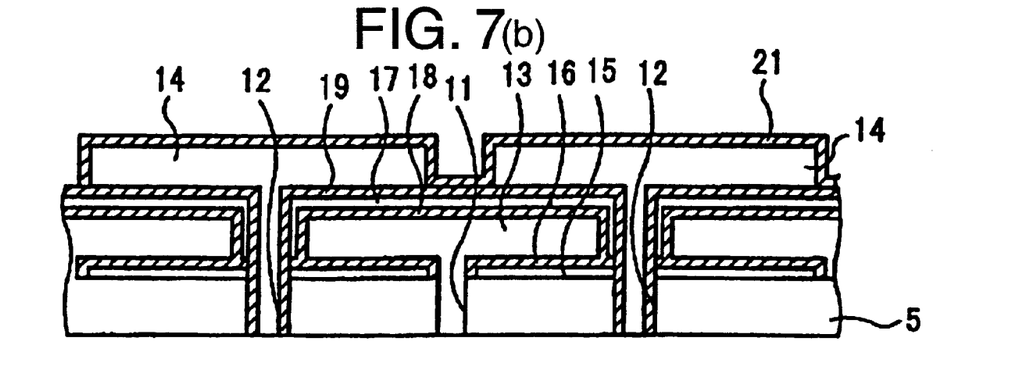
Figure 7C:
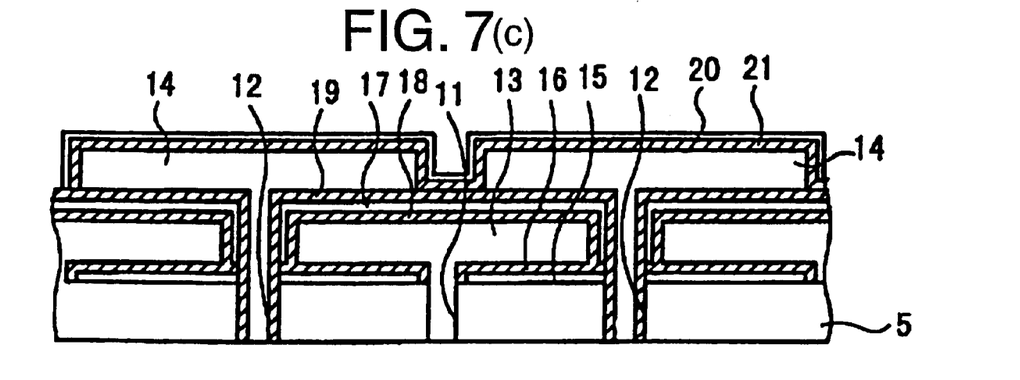

Then, the resist 30 is removed, and the upper layer insulating films 19 are deposited on the entire plane (FIG. 6(a)). Next, the conductive film 31 is deposited so as to be filled in the upper layer contact holes 12 and cover the entire plane (FIG. 6(b)). Next, a patterned resist 32 is deposited on the conductive film (FIG. 6(c)). Next, the conductive film 31 is etched, the resist 32 serving as a mask, to form the upper layer storage nodes 14 (FIG. 6(d)). Next, the resist 32 is removed (FIG. 7(a)), and the upper layer insulating a film 21 is deposited on the entire plane (FIG. 7(b)). Next, the upper layer cell plate 20 is deposited on the entire plane (FIG. 7(c)), thus providing the lower layer capacitors 22 and the upper layer capacitors 23 as shown in FIG. 1.

Figure 8A:
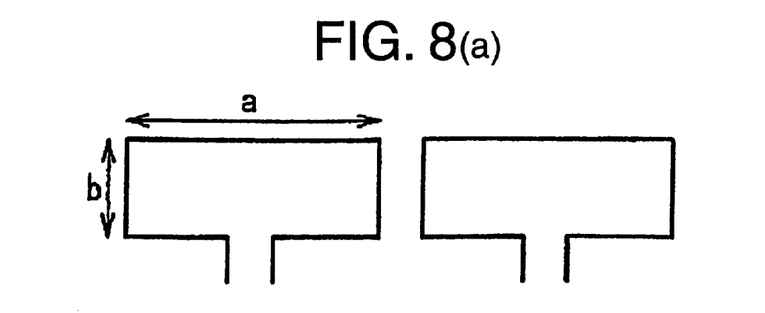
FIGS. 8(a) and 8(b) are views to explain the difference between a semiconductor device according to the present invention and a conventional semiconductor device in terms of capacitance.

The difference between the capacitor capacity of the conventional semiconductor device and that of the semiconductor device thus prepared will be explained referring to FIGS. 8(a) and 8(b). As shown in FIG. 8(a), it is assumed that a conventional storage node has a traverse length of "a" and a height of "b", that the storage node has a square plane shape, that the storage node has a longitudinal length of "a", which is not shown in this figure, and that the area of the contact hole is ignored. The surface area $S_1$ of the conventional storage node is found as a value represented by the following equation (1):

$$S_1 = 2 \times a \times a + 4 \times a \times b = 2a^2 + 4ab \qquad (1)$$

Figure 8B:
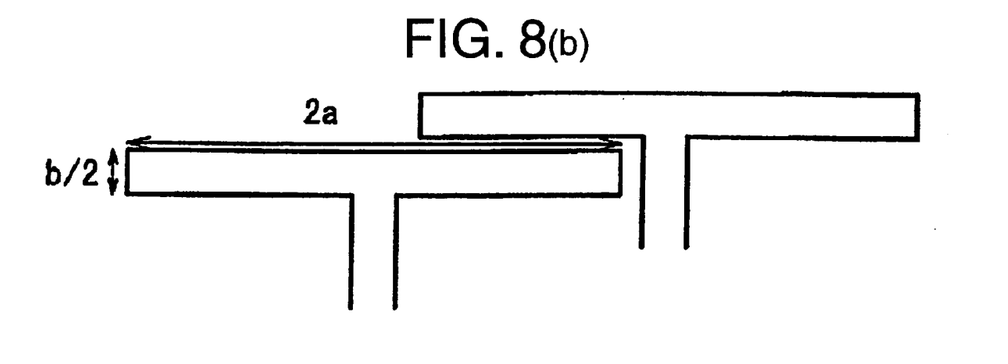

On the other hand, the storage node according to the present invention has a transverse length of "2a" and a height of "b/2" in comparison with the conventional one as shown in FIG. 8(b). The surface area $S_2$ of the storage node according to the present invention is found as a value represented by the following equation (2):

$$S_2 = 2 \times 2a \times 2a + 4 \times 2a \times b/2 = 8a^2 + 4ab \qquad (2)$$

It is evident that the surface area $S_2$ of the storage node according to the present invention is larger than the surface area $S_1$ of the conventional one, and consequently that the storage node according to the present invention can ensure more capacitor capacity than the conventional one.

In accordance with the semiconductor device thus constructed according to the first embodiment, the capacitors of adjoining memory cells are formed in different layers, and the region with a capacitor formed therein and a region with an adjoining capacitor formed therein partly overlap in a planar direction.

The lower layer capacitors 22 are formed at the certain intervals, and the upper layer contact holes 14 and the upper layer capacitors 23 are formed at the certain spaced locations that have been given by forming the lower layer capacitors. Since the lower layer capacitors 22 per se and the upper layer capacitors 23 per se can be formed without substantially modifying a conventional fabrication process, it is not difficult to form these capacitors.

Embodiment 2

Figure 9:
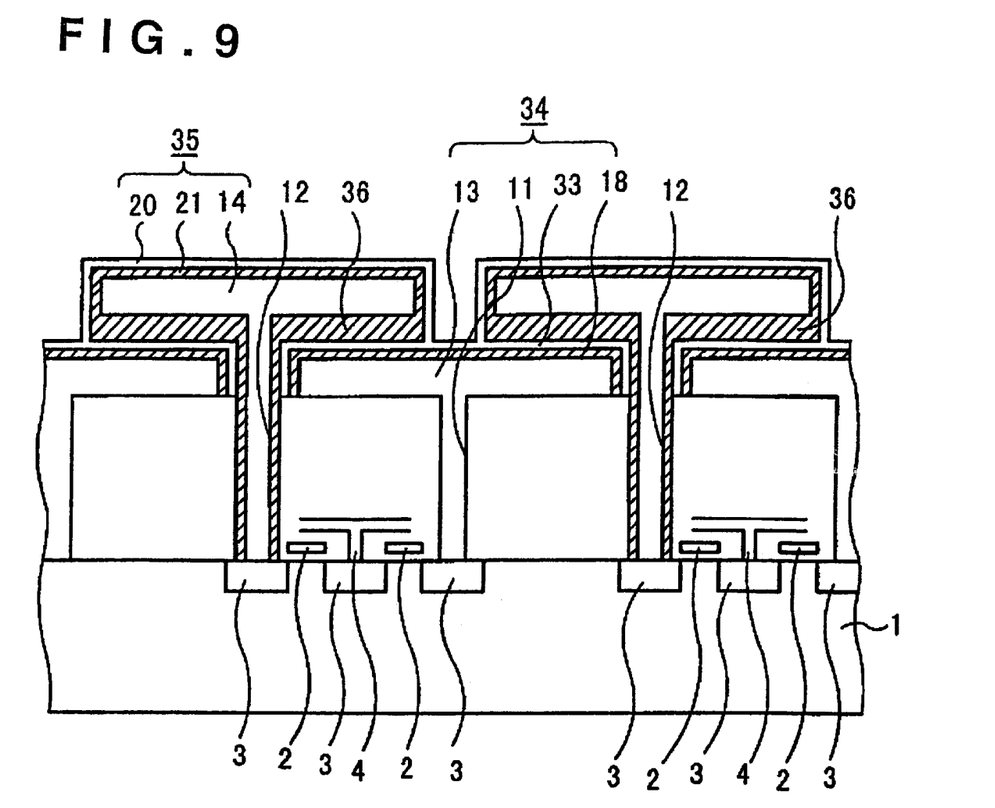
FIG. 9 is a cross-sectional view showing the structure of a semiconductor device according to a second embodiment of the present invention.

Although the respective storage nodes have the lower sides, as well as the upper sides, provided with the cell plates in the first embodiment, the present invention is not limited to such a mode, and the respective storage nodes may have only the upper sides provided with the cell plates. For example, as shown in FIG. 9, lower layer capacitors 34 are formed from the lower layer storage nodes 13, the lower layer insulating films 18 and the lower layer cell plates 33, and upper layer capacitors 35 are formed from the upper layer storage nodes 14, the upper layer insulating films 21 and the upper layer cell plates 20.

In this mode, the thickness of insulating films 36 above the lower layer cell plates 33 increases to electrically insulate the lower layer cell plates 33 from the upper layer capacitors 35 in order to prevent the lower layer cell plates 33 for the lower layer capacitors 34 from working as parts of the cell plates for the upper layer capacitors 35.

In accordance with the semiconductor device thus constructed according to the second embodiment, the storage nodes can have only the upper sides provided with the cell plates to simplify and facilitate the fabrication process, though the capacitor capacity decreases in comparison with the first embodiment.

Figure 10A:
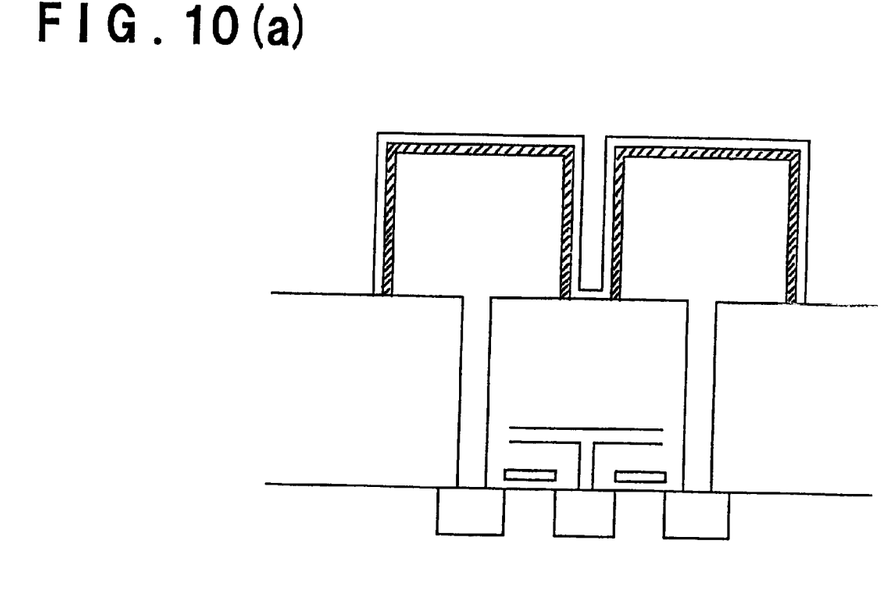
FIGS. 10(a) and 10(b) are views showing modified example of a storage node.
Figure 10B:
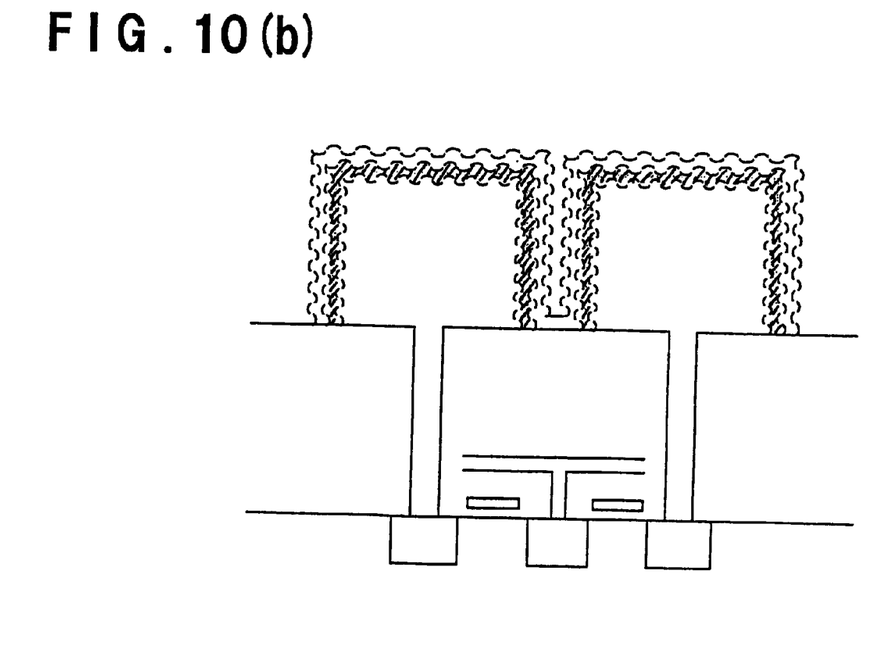

Although explanation of the respective embodiments has been made with respect to a case wherein the storage nodes have a rectangular parallelepiped shape, the shape of the storage nodes is not limited to such a type. For example, if the storage nodes are formed in a cylindrical shape (see FIG. 10(a)) and/or formed so as to have rough surfaces (see FIG. 10(b)), and if adjoining capacitors are provided so as to be located in different layers of the upper and lower layers and have the forming regions partly overlapped in a planar direction as in the respective embodiments, this modification can offer effects similar to the respective embodiments and ensure much more capacitor capacities.

If the lower layer capacitors are provided at the certain intervals, and the upper layer contact holes and the upper layer capacitors are provided at the certain spaced locations that have been given by forming the lower layer capacitors in this modification as in the respective embodiments, the upper layer capacitors per se and the lower layer capacitors per se can be formed without substantially modifying a conventional fabrication step, and the forming process can not be prevented from being difficult.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 11-248177 filed on Sep. 2, 1999 including specification, claims, drawings and summary are incorporated herein by reference in its entirety.

What is claimed is:

1. A semiconductor device comprising:

a semiconductor substrate;

a dielectric interlayer film disposed on the semiconductor substrate; and a plurality of memory cells disposed on the dielectric interlayer film, each memory cell including a capacitor, the capacitors of adjoining memory cells being respectively located in first and second layers, the first layer being farther from the semiconductor substrate than the second layer, the capacitors being arranged so that a first region including a first capacitor in the first layer partially overlaps a second region adjoining the first region and including a second capacitor in the second layer, when viewed in a plane parallel to the semiconductor substrate, each of the capacitors including first and second electrically conductive cell plates separated by respective insulating layers, wherein each of the capacitors in the first layer has a first side insulating film and a second side insulating film, the first side insulating film being farther from the semiconductor substrate than the second side insulating film, the second side insulating film being thicker than the first side insulating film, each of the capacitors in the second layer has a side adjacent the second side insulating film so that a cell plate of the capacitor in the first layer is directly opposite and separated by the second side insulating film from a cell plate of a capacitor in the second layer, and each of the capacitors in the second layer has a cell plate in contact with the dielectric interlayer film.

2. The semiconductor device according to claim 1, wherein the respective capacitors have storage nodes with a cylindrical shape.

3. The semiconductor device according to claim 1, wherein the respective capacitors have storage nodes with rough surfaces.

4. The semiconductor device according to claim 1, wherein each of the memory cells includes part of the dielectric interlayer film and has a contact hole extending through the dielectric interlayer film to the semiconductor substrate, the first memory cell has a first contact hole and includes a first electrically conducting material filling the first contact hole and directly contacting the dielectric interlayer film in the first contact hole, and the second memory cell adjoining the first memory cell includes a second contact hole, a second electrically conducting material in the second contact hole, and an electrically insulating film in the second contact hole completely separating the second electrically conducting material from the dielectric interlayer film.

5. The semiconductor device according to claim 4, wherein the respective capacitors have storage nodes with rough surfaces.

* * * * *